United States Patent [19]

Yorks et al.

[11] 4,047,233
[45] Sept. 6, 1977

[54] SHORT CIRCUIT PROTECTION CIRCUIT

[75] Inventors: Robert G. Yorks, W. Bloomfield; David W. Junker, Novi, both of Mich.

[73] Assignee: Essex Group, Inc., Fort Wayne, Ind.

[21] Appl. No.: 676,824

[22] Filed: Apr. 14, 1976

[51] Int. Cl.² .............................................. H02H 3/20
[52] U.S. Cl. ....................................... 361/88; 361/101
[58] Field of Search ............... 307/10 R; 361/88, 101; 315/77, 82, 83; 340/371, 81 R, 251, 172

[56] References Cited

U.S. PATENT DOCUMENTS

| 3,578,983 | 5/1971 | Kondo | 361/88 |
|---|---|---|---|
| 3,591,833 | 7/1971 | Bolinger | 361/101 |
| 3,889,159 | 6/1975 | Wessel | 361/88 |

Primary Examiner—Herman J. Hohauser
Attorney, Agent, or Firm—Lawrence E. Freiburger; Robert D. Sommer

[57] ABSTRACT

In a circuit of the type in which a command signal actuates a semiconductor switch which, in turn, actuates a load device and in which a clock signal is available, a protection circuit for protecting the semiconductor switch located in series with the load from excessive current in the event the load device is short circuited. The protection circuit includes a sensing circuit for sensing the voltage level at a point intermediate the semiconductor switch and the load. The protection circuit interfaces between the command signal and the clock signal in such a manner that the semiconductor switch is repeatedly momentarily energized if the load is shorted and a command signal is present.

5 Claims, 6 Drawing Figures

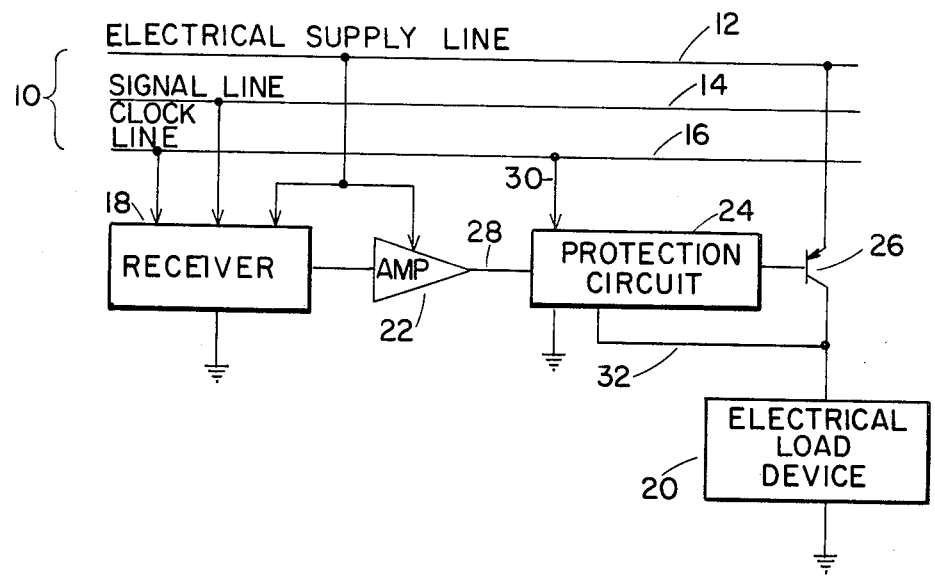
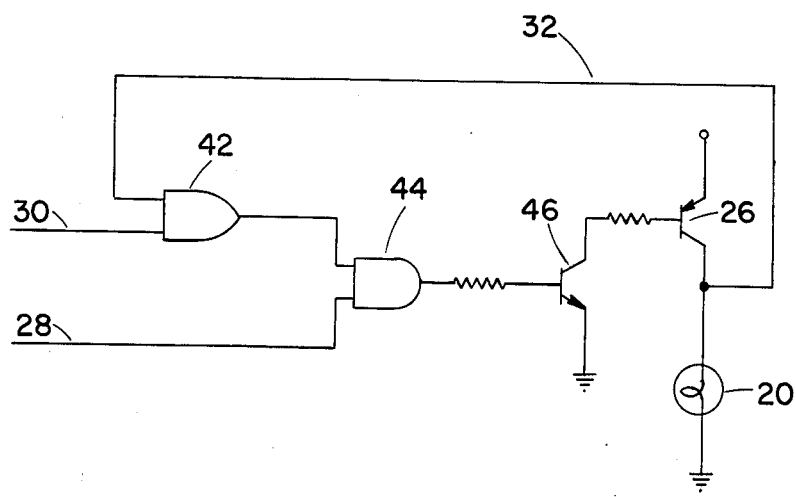

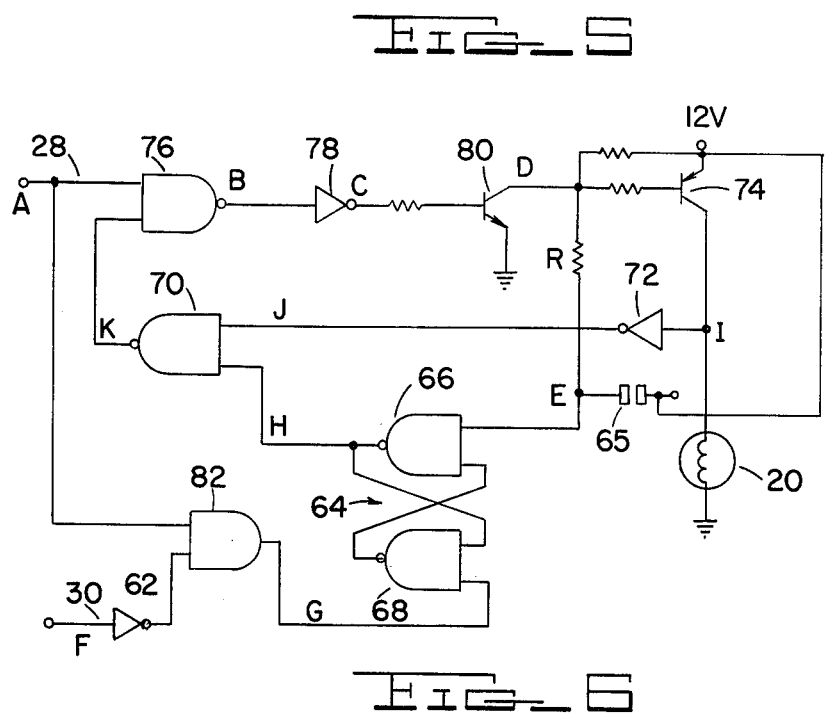
FIG_5
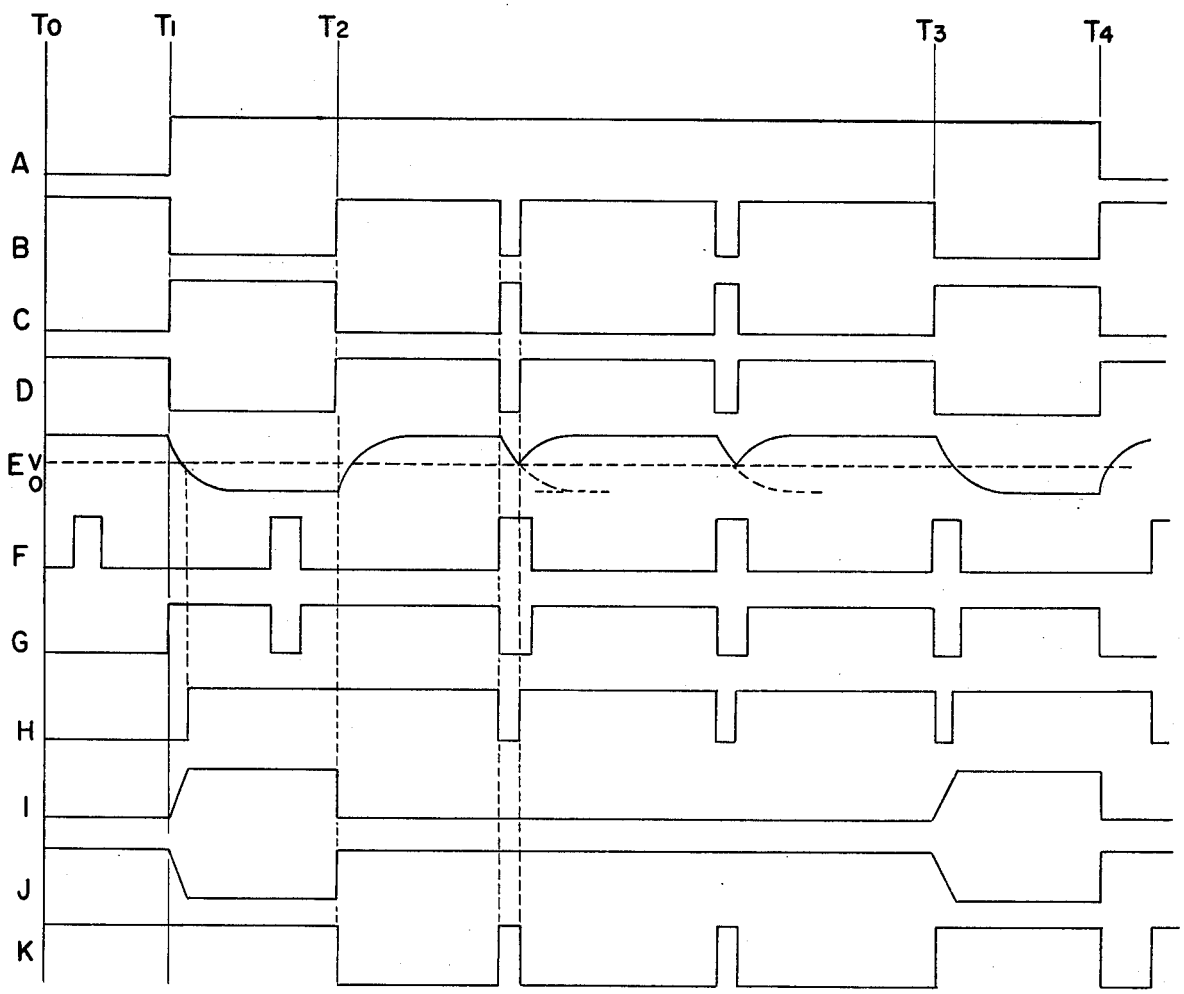
FIG_6

SHORT CIRCUIT PROTECTION CIRCUIT

BACKGROUND OF THE PRESENT INVENTION

The present invention relates generally to protection circuits and particularly is concerned with such a circuit useful in conjunction with multiplexed vehicle control systems such as the one disclosed in U.S. Pat. No. 3,648,057, issued to Peter W. Sognefest et al and assigned the same assignee as the present application.

Vehicular control and distribution systems such as the one disclosed in the Sognefest et al patent have generally included a receiver circuit which actuates one or more load devices upon receipt of the proper input information. The receiver circuit, upon receipt of the proper input information, provides a continuous output command signal which energizes a semiconductor switch located in series with the electrical load device to actuate it.

In the past is has happened, much more often than desired, that a short has occurred across the load device, thus placing the entire supply voltage across the semiconductor switch. Inasmuch as the semiconductor switch is not designed to handle the excessive currents brought about by the short circuit condition at the load, it is eventually destroyed, resulting in the added inconvenience of replacing the semiconductor switch as well as correcting the short circuit condition at the load. This procedure, of course, results in the added time and labor necessary to replace the semiconductor switch as well as the cost of the switch itself.

SUMMARY OF THE INVENTION

Thus it is an object of the present invention to provide a circuit which protects the semiconductor switch in such systems from destruction due to a short circuited load device.

Another object of this invention is to provide the above circuit protection where the nature of the load device is such that the voltage rise across the load is delayed with respect to the inception of load current. This occurs, for example, when the device is an incandescent lamp or an electric motor.

The objects of the invention are accomplished by a digital logic protection circuit which includes a sensing circuit for sensing the voltage across the load device and circuit means responsive to the sensing circuit, the command signal from a receiver circuit, and the clock signal for controlling the energization of the semiconductor switch in series with the load.

The above-noted objects of the invention as well as others will further become apparent from the detailed description of the invention taken in conjunction with the drawings in which:

BRIEF DESCRIPTION OF THE DRAWINGS

FIG. 1 is a schematic diagram of a portion of a control system employing a protection circuit in accordance with the present invention;

FIG. 2 is a schematic diagram of a protection circuit in accordance with the present invention;

FIG. 5 is a schematic diagram of still another embodiment of a protection circuit in accordance with the present invention; and FIG. 6 is a timing diagram of the voltage levels at various points in the circuit of FIG. 5.

DETAILED DESCRIPTION OF THE PREFERRED EMBODIMENT OF THE INVENTION

Figure 3:
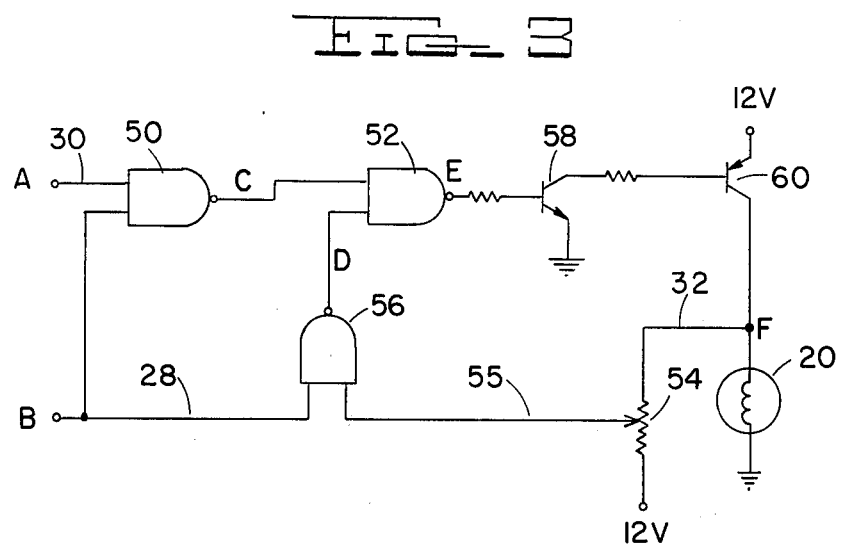
FIG. 3 is a schematic diagram of a second embodiment of a protection circuit in accordance with the present invention.

Referring now to FIG. 1 there is disclosed the receiver portion of a single harness control system such as that disclosed in the above-mentioned Songefest et al patent, the teachings of which are incorporated herein by reference. However, the circuit disclosed in FIG. 1 provides a protection circuit which was not provided for in the prior art. Briefly, the control system includes a three wire harness 10 comprising an electrical supply line 12 connected to a voltage source, a signal line 14 which carries electrical signals generated by the sender modules, and a clock line which carries the clock signals. A receiver circuit 18 ascertains whether the information on the supply line and the clock line indicate whether or not the electrical load device 20 associated with that particular receiver circuit is to be energized. The output of the receiver circuit 18 in the form of a DC voltage level is amplified by amplifier 22, and applied to a protection circuit 24, the purpose of which is to protect switching transistor 26 in the event load device 20 is shorted. It will be seen that the protection circuit 24 receives a "command" signal on line 28 from amplifier 22, the clock signal on line 30, and a signal indicative of whether or not the load 20 is shorted on line 32 and processes the information on these lines to control the conductive state of switching transistor 26.

One embodiment of a protection circuit of the present invention is shown in FIG. 2. The principles of the present invention as illustrated in FIG. 2 and the circuits hereafter described are positive logic circuits. It will be understood that negative logic circuits may be equally well employed.

Referring now to FIG. 2 the command signal on line 28 is applied to one input of AND gate 44. The clock signal on line 30 is applied to one input of OR gate 42. The load voltage sensing signal on line 32 is applied to the other input of OR gate 42. The output from OR gate 42 is applied to the second input of AND gate 44. AND gate 44 controls the voltage level at the base of an NPN transistor 46 which, in turn, controls the voltage level at the base of PNP transistor 26. An electrical load device 20 depicted in FIG. 2 is a lamp located in series with switching transistor 26 in such a manner that the lamp 20 will be energized when the transistor is conductive. It will be understood that the electrical load 20 in FIG. 2 need not necessarily be a lamp load and could be another type of a load, such as an electrical motor, for instance.

The operation of the circuit in FIG. 2 will now be described. It will be noted that if line 28 is low, the output of AND gate 44 will be low regardless of whether the output of OR gate 42 is high or low. Hence, when line 28 is low transistors 46 and 26 will not be energized. If line 28 is high, and either line 30 or line 32 is high, then both inputs to AND gate 44 will be high since the output of OR gate 42 will be high. When both inputs to AND gate 44 are high, its output will be high and transistors 46 and 26 will be energized so that load current will be turned on. Lines 28 and 30 will both be high only during the time interval when the clock pulse is present. If the time constant of load 20 is short enough to permit the voltage across the load to respond during the interval in which the clock signal is high, the circuit will be latched in the "on" position at the end of the clock pulse interval by the "high" signal being fed through OR gate 42 to AND gate 44. If, however, the output load 20 is shorted this latching action will not occur since the signal on line 32 will remain low and the output of OR gate 42 will go low when the clock pulse terminates and the transistors 46 and 26 will be deenergized. As long as the short circuit persists, and line 28 is held high, the output transistor will be turned on during the interval in which the clock pulse is on or high and off at the end of this interval. It is therefore essential that the clock pulse duration be made short enough so that the output transistor will not be damaged during the clock pulse interval. The pulse repetition rate must also be limited to insure against cumulative damage.

In FIG. 3, a second embodiment of the protection circuit is disclosed. It will be noted that this circuit requires an additional connection to the supply line. In FIG. 3, the clock signal on line 30 and the command signal on line 28 are applied to a NAND gate 50. The command signal on line 28 is also applied to NAND gate 56, the other input of which is the voltage level on line 55. The output of NAND gates 50 and 56 are applied to NAND gate 52, the output of which controls the conductive state of transistor 58. Transistor 58, in turn, controls switching transistor 60, which energizes lamp load 20, when conductive.

Figure 4:
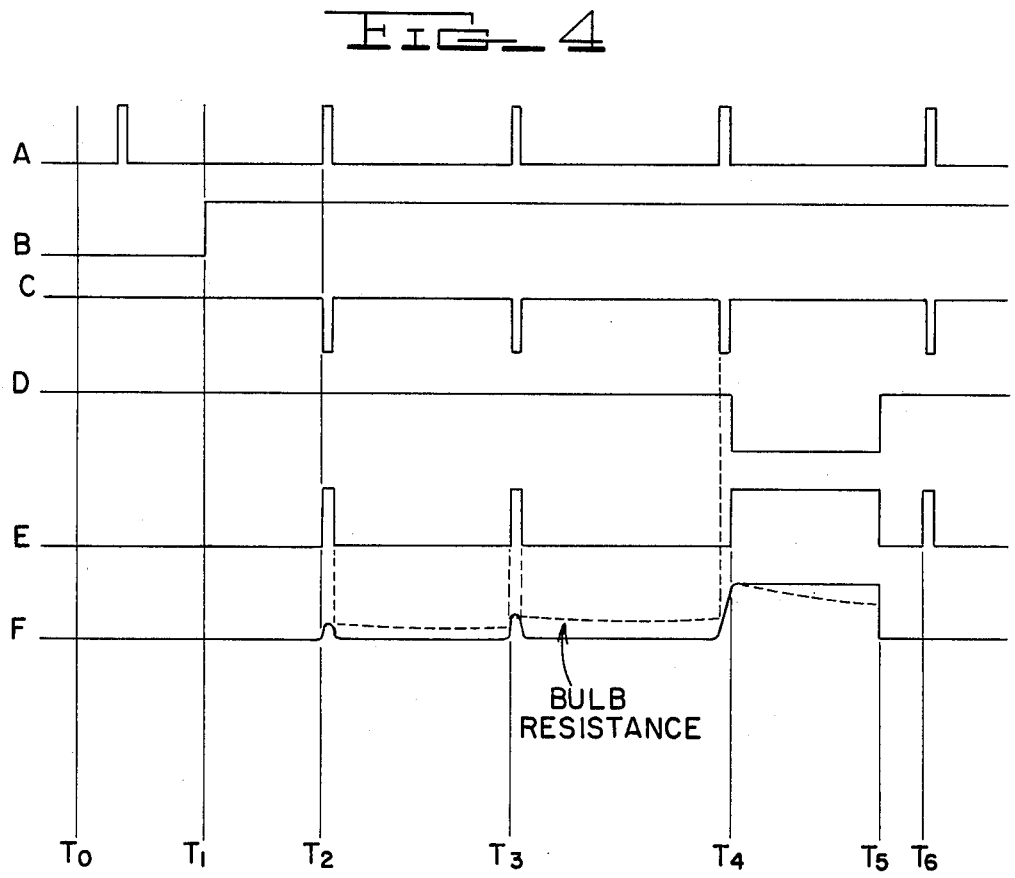
FIG. 4 is a timing diagram of the voltage levels at various points in the circuit of FIG. 3.

The operation of the circuit of FIG. 3 will be described in conjunction with the timing diagram of FIG. 4. The points in the circuit of FIG. 3 where the various voltage waveforms of FIG. 4 appear are labeled A, B, C, D, E and F. At time To, command signal B and clock train A are both low so that point C is high. Also, point D is high so that the voltage at E remains low, thus ensuring that transistor 60 is off and the voltage at point F is low. At time T1 the command signal B goes high, indicating that the load is to be energized. It will be appreciated, however, that the voltage at C will not go low and consequently E will not go high until clock signal A goes high at T2. At time T2, E remains high only as long as A remains high so that transistor 60 is only momentarily conductive. Lamp load 20 thus receives a voltage pulse at time T2, but because of the short duration of this pulse, lamp load 20 is not fully energized. However, because the filament of incandescent lamp 20 exhibits a positive temperature coefficient of resistance, the pulse at T2 will slightly heat the filament so that its resistance increases slightly. The effect of the resistance of the filament is shown in the dotted line in voltage waveform F and it will be appreciated that at time T2 the voltage on line 55 remains below the threshold level of gate 56 so that D remains high. At time T3, lamp 20 is again pulsed to increase its filament resistance. However, the voltage on line 55 does not go above the threshold level of gate 56 so that point D still remains high. Eventually, the bulb resistance will increase to the point that the voltage on line 55 goes above the threshold level of gate 56 so that point D goes low, such as at time T4. When this happens the voltage at E is latched in the high state, thus ensuring that the lamp 20 is continuously energized. At time T5 a short appears across the lamp 20, thus pulling point F low. As a result, the voltage on line 55 will go below the threshold level of gate 56 so that D reverts to a high state. Therefore, point E will go low, turning transistor 60 off.

At time T6, point C goes low so that transistor 60 is momentarily energized. However, because the short still remains across the lamp 20, point E will revert to a low state as soon as C goes high. The sampling pulses at point E will continue to energize transistor 60 momentarily as long as command signal B remains high but the transistor 60 will not continuously be turned on until the short across lamp 20 is removed.

In the circuit of FIG. 3 it will be appreciated that the setting on potentiometer 54 is determined by the duty cycle of clock signal A and the temperature coefficient of lamp 20. It will be clear that if the duty cycle of clock signal A is too small lamp 20 will never become energized or will be energized only after a substantial time delay.

Referring to FIG. 5, the clock signal on line 30 is applied to an inverter 62, the output of which is applied to an AND gate 82. The output of AND gate 82 is applied to one input of latch 64 consisting of cross coupled NAND gates 66 and 68. The other input to AND gate 82 is the command signal 28. The other input to the latch 64 is the voltage at the junction of resistor R and a capacitor 65 which is connected to a positive source of voltage. One output of cross couple 64 is applied to NAND gate 70 along with the output from an inverter 72 which receives the voltage at the junction of lamp 29 and switching transistor 74. The output of NAND gate 70 and the command signal on line 28 are applied to a NAND gate 76, the output of which is inverted by inverter 78. The output of inverter 78 controls NPN transistor 80 which controls the conductive state of transistor 74.

The operation of the circuit of FIG. 5 will not be described in conjunction with the timing diagrams of FIG. 6. The voltages at the various points in the circuit of FIG. 5 have been indicated by letters and these letters are correspondingly used in the timing diagrams of FIG. 6.

In FIG. 6, at time To, the lamp is off and command signal A is low, thus indicating that the lamp is to remain off. Thus, it can be seen that capacitor 65 will be discharged back to the supply voltage point, so that E is high and that point J will be high also. Therefore, cross couple will be latched so that H is low, thus ensuring that K is high. As a result, point C will be low so that transistor 80 will be off and transistor 74 is off. A time T1 command signal A goes high so that C goes high to energize transistor 74 and lamp 20. When point C goes high and transistor 80 is rendered conductive, it will be seen that capacitor C will charge so that the output of gate 66 goes high when point E goes below the threshold voltage of the gate. At the same time, point J will be decreasing in voltage so that the output of NAND gate 70 remains high as long as the lamp is not shorted. At time T2, the lamp becomes shorted so that point J goes high, thus switching point K to the low state, resulting in the deenergization of transistor 74. When this occurs, capacitor C begins to discharge and the output H of latch 64 goes low when E goes above the threshold of gate 66 and clock pulse F goes high, thus resetting the latch. Therefore, transistor 74 will again be energized but will be deenergized as soon as capacitor C charges and point E goes below the threshold level of gate 66 if the lamp is still short circuited. The circuit continues in this cyclic manner where transistor 74 is alternately energized and deenergized until the command signal is removed or the short circuit condition is corrected. Thus, at T3 the short circuit condition is corrected and it can be seen that transistor 74 is latched in the conductive state. At time T4, the command signal is removed, so that transistor 74 is deenergized, thus deenergizing the lamp 20.

It will be appreciated by those skilled in the art that the values of R and C should be selected so that capacitor C charges to the threshold level of gate 66 after point J has gone low in order to ensure that transistor 74 is continuously conductive. Therefore, the values of R and C are dependent upon the turn on delay of lamp 20.

From the foregoing description of the various embodiments of the invention, it will be seen that the present invention thus provides a means of protecting a switching transistor in the event a load in series therewith is short circuited, thus obviating the expense necessary to replace a switching transistor which has been destroyed due to the short circuit condition at the load. Further, all the circuits of the present invention automatically restore power to the load device when the short circuit is removed.

Although three embodiments of the invention have been disclosed, obvious modifications and other embodiments will occur to those skilled in the art. It is therefore intended that the foregoing discussion be for illustrative purposes only and that the invention be defined in the appended claims.

What is claimed is:

1. In a switching circuit for controlling the application of power to a load including a semiconductor switch in series with said load connected across a source of power, means for providing a clock signal switching between first and second states, means for providing a command signal switching from a first state to a second state when it is desired to energize said load, a protection circuit for protecting said semiconductor switch in the event said load is short circuited, comprising:

sensing circuit means for sensing the voltage across said load and for providing an output signal indicative of whether or not said load is shorted; and circuit means responsive to the output signal of said sensing circuit, said command signal and said clock signal for actuating said semiconductor switch when said command signal switches from said first state to said second state or shortly thereafter, said circuit means thereafter maintaining said semiconductor switch in said actuated state as long as said command signal remains in said second state and the output of said sensing circuit means indicates said load is not shorted, said circuit means momentarily energizing said semiconductor switch when said command signal is in said second state and the output of said sensing circuit means indicates said load is short circuited.

2. The protection circuit as claimed in claim 1, wherein said circuit means comprises:

first logic circuit means responsive to said clock signal and the output signal of said sensing circuit means for providing a high output signal when the output of sensing circuit is high or when clock signal is high;

second logic circuit means responsive to the output signal of first logic circuit means and said command signal for providing a high output signal when first logic circuit means has a high output signal and said command signal is high and circuit means for energizing said electronic switch when the output signal from second logic circuit means is high.

3. A protection circuit as claimed in claim 1, wherein said sensing circuit responds to predetermined voltage threshold.

4. A protection circuit as claimed in claim 1, wherein said sensing circuit includes time delay means for delaying the application of continuous power to said load.

5. A protection circuit as claimed in claim 1, wherein the pulse duration and the pulse repetition rate of said clock signal is selected so that the power dissipation of the output switching device remains within safe limits.

* * * * *